United States Patent
Sawada et al.

(10) Patent No.: US 8,066,825 B2
(45) Date of Patent: *Nov. 29, 2011

(54) (COFE)ZR/NB/TA/HF BASED TARGET MATERIAL

(75) Inventors: Toshiyuki Sawada, Himeji (JP); Akihiko Yanagitani, Himeji (JP); Ryoji Hayashi, Himeji (JP); Yoshikazu Aikawa, Himeji (JP)

(73) Assignee: Sanyo Special Steel Co., Ltd., Hyogo-Ken (JP)

( * ) Notice: Subject to any disclaimer, the term of this patent is extended or adjusted under 35 U.S.C. 154(b) by 655 days.

This patent is subject to a terminal disclaimer.

(21) Appl. No.: 11/941,504

(22) Filed: Nov. 16, 2007

(65) Prior Publication Data

US 2008/0138235 A1    Jun. 12, 2008

(30) Foreign Application Priority Data

Nov. 17, 2006   (JP) ................. 2006-311129

(51) Int. Cl.
  *H01F 1/147*   (2006.01)
  *C23C 14/34*   (2006.01)
(52) U.S. Cl. .... 148/315; 148/313; 148/311; 204/298.13
(58) Field of Classification Search .......... None
  See application file for complete search history.

(56) References Cited

U.S. PATENT DOCUMENTS

| | | |
|---|---|---|
| 4,992,095 A | 2/1991 | Nate et al. |
| 5,587,026 A | 12/1996 | Iwasaki et al. |
| 5,780,175 A | 7/1998 | Chen et al. |
| 6,033,536 A | 3/2000 | Ichihara et al. |
| 6,632,520 B1 | 10/2003 | Hiramoto et al. |
| 6,828,046 B2 | 12/2004 | Ikeda et al. |
| 7,141,208 B2 | 11/2006 | Ueno et al. |
| 7,294,418 B2 | 11/2007 | Ikeda et al. |
| 2002/0058159 A1 | 5/2002 | Kubota et al. |
| 2006/0042938 A1 | 3/2006 | Cheng et al. |
| 2006/0199044 A1 | 9/2006 | Thangaraj et al. |
| 2007/0017803 A1 | 1/2007 | Ziani et al. |
| 2007/0251821 A1 | 11/2007 | Yanagitani et al. |
| 2008/0083616 A1 | 4/2008 | Fukuoka et al. |
| 2008/0112841 A1 | 5/2008 | Hayashi et al. |

FOREIGN PATENT DOCUMENTS

| | | | |
|---|---|---|---|
| JP | 62040363 A | | 2/1987 |
| JP | 4325670 A | | 11/1992 |
| JP | 6035654 B | | 5/1994 |
| JP | 2004346423 A | | 12/2004 |
| JP | 2005320627 | | 11/2005 |
| JP | 2007-284741 | * | 11/2007 |
| JP | 2007-297688 | * | 11/2007 |

OTHER PUBLICATIONS

Machine Translation of Japanese Patent Document No. 2005-320627.*

Hansen, Max, PhD, et al., "Constitution of Binary Alloys", 2nd ed., 1958, pp. 471-474, McGraw-Hill Book Company, Inc., USA.

* cited by examiner

*Primary Examiner* — John Sheehan
(74) *Attorney, Agent, or Firm* — The Webb Law Firm

(57) ABSTRACT

A (CoFe)Zr/Nb/Ta/Hf based target material is provided which is capable of achieving a high sputtering efficiency and a high sputtering effect by increasing the leakage magnetic flux in the magnetron sputtering, and a method for producing the target material. This target material is made of an Fe—Co based alloy comprising not less than 80 atomic % in total of Fe and Co having an Fe:Co atomic ratio of 80:20 to 0:100, and less than 20 atomic % of one or more selected from the group consisting of Zr, Hf, Nb and Ta. The Fe—Co based alloy comprises a Co—Fe phase being a ferromagnetic phase, and the one or more selected from the group consisting of Zr, Hf, Nb and Ta are incorporated in solid solution form into the Co—Fe phase in a total amount of 0.5 to 2 atomic %.

2 Claims, No Drawings

(COFE)ZR/NB/TA/HF BASED TARGET MATERIAL

CROSS-REFERENCE TO RELATED APPLICATION

The present application claims priority to Japanese Patent Application No. 2006-311129 filed on Nov. 17, 2006, the disclosure of which is incorporated herein by reference.

BACKGROUND OF THE INVENTION

1. Field of the Invention

This invention relates to a (CoFe)Zr/Nb/Ta/Hf based target material used for forming a thin film for electronic components, such as a soft magnetic underlayer mainly used in a perpendicular magnetic recording medium, and to a method for producing the (CoFe)Zr/Nb/Ta/Hf based target material.

2. Description of Related Art

The recent progress in the magnetic recording technology is remarkable, and the record densities of magnetic record media are being heightened for increasing capacities of drives. In the magnetic record media for the longitudinal magnetic recording systems currently used worldwide, however, an attempt to realize a high record density leads to refined record bits, which require a high coercivity to such an extent that recording cannot be made with the record bits. In view of this, a perpendicular magnetic recording system is under study as a means of solving these problems and improving the record densities.

Japanese Patent Laid-Open Publication No. 2005-320627 discloses a method for producing a Co alloy target material comprising 1 to 10 atomic % of Zr, 1 to 10 atomic % of Nb and/or Ta, and the balance consisting essentially of Co, with regard to a target material used for forming a thin film for electronic components, such as a soft magnetic underlayer in a perpendicular magnetic recording medium. In this method, a Co alloy is subjected to a rapid solidification process to produce an alloy powder, and then the alloy powder having a particle size of 500 μm or less is pressed and sintered.

However, a soft-magnetic target material as disclosed in Japanese Patent Laid-Open Publication No. 2005-320627 has a disadvantage that the sputtering efficiency is reduced by low-leakage magnetic flux in the magnetron sputtering process because its alloy composition typically results in a high magnetic permeability. In a typical method of producing such a CoZrTa/Nb/Hf based target material, powder which is produced by a gas atomizing technique is consolidated and shaped through a hot hydraulic pressing process at 800° C. to 1200° C.

Meanwhile, magnetron sputtering method is generally used for the preparation of the aforementioned soft magnetic films. This magnetron sputtering method is a method in which a magnet is disposed behind a target material to leak the magnetic flux onto a surface of the target material for converging plasma in the leaked magnetic flux region, enabling a high-speed coating. Since the magnetron sputtering method has a feature of leaking the magnetic flux on the sputtering surface of the target material, in the case where magnetic permeability of the target material itself is high, it is difficult to form, on the sputtering surface of the target material, the leaked magnetic flux necessary and sufficient for the magnetron sputtering method. In view of this, there has been a demand for reducing the magnetic permeability of the target material itself as much as possible.

SUMMARY OF THE INVENTION

The inventors have now found that a high sputtering efficiency and a high sputtering effect can be realized by the use of a target material comprising a ferromagnetic Co—Fe phase into which one or more selected from the group consisting of Zr, Hf, Nb and Ta are solid-solved in a total amount of 0.5 to 2 atomic % through an increase in the leakage magnetic flux during the magnetron sputtering. The inventors have also found that such a target material can be obtained by consolidating a powder, which is prepared through a rapid solidification technique, at a temperature equal to or less than $[-294\times[Fe/(Fe+Co)]+1076]$ ° C.

It is therefore an object of the present invention to provide a (CoFe)Zr/Nb/Ta/Hf based target material and a method for producing the (CoFe)Zr/Nb/Ta/Hf based target material capable of achieving a high sputtering efficiency and a high sputtering effect through an increase in the leakage magnetic flux during the magnetron sputtering.

According to the present invention, there is provided a (CoFe)Zr/Nb/Ta/Hf based target material, which is made of an Fe—Co based alloy comprising:

not less than 80 atomic % in total of Fe and Co having an Fe:Co atomic ratio of 80:20 to 0:100, and less than 20 atomic % of one or more selected from the group consisting of Zr, Hf, Nb and Ta, wherein the Fe—Co based alloy comprises a Co—Fe phase being a ferromagnetic phase, and wherein the one or more selected from the group consisting of Zr, Hf, Nb and Ta are incorporated in solid solution form into the Co—Fe phase in a total amount of 0.5 to 2 atomic %.

According to the present invention, there is also provided a method for producing a (CoFe)Zr/Nb/Ta/Hf based target material, comprising the steps of:

providing a raw-material powder prepared by inert gas atomization, and consolidating the raw-material powder at a temperature ranging from 800° C. or higher to $[-294\times[Fe/(Fe+Co)]+1076]$ ° C. or lower to form a Co—Fe phase being a ferromagnetic phase wherein one or more selected from the group consisting of Zr, Hf, Nb and Ta is solid-solved into the Co—Fe phase in a total amount of 0.5 to 2 atomic %.

DETAILED DESCRIPTION OF THE INVENTION (CoFe)Zr/Nb/Ta/Hf Based Target Material The reasons for the compositional limitations in the present invention will be described below.

The (CoFe)Zr/Nb/Ta/Hf based target material according to the present invention is made of an Fe—Co based alloy comprising not less than 80 atomic % in total of Fe and Co having an Fe:Co atomic ratio of 80:20 to 0:100, and less than 20 atomic % of one or more selected from the group consisting of Zr, Hf, Nb and Ta. The Fe—Co based alloy comprises a Co—Fe phase being a ferromagnetic phase, while the one or more selected from the group consisting of Zr, Hf, Nb and Ta are solid-solved into the Co—Fe phase in a total amount of 0.5 to 2 atomic %.

The target material of the present invention is made of a Fe—Co based alloy mainly comprising Fe and Co. A Fe—Co based alloy is preferably used for a perpendicular magnetic recording film as an alloy system having a high saturated magnetic flux density.

The Fe—Co based alloy forming the target material of the present invention comprises 80 atomic % or more in total of Fe and Co having an Fe:Co atomic ratio of 80:20 to 0:100. This is because a Co content of more than 80% in relation to Fe leads to deteriorations in magnetic characteristics. In addition, the total amount of Fe and Co needs to be 80% or more since a total amount of less than 80% leads to deteriorations in magnetic characteristics.

The Fe—Co based alloy forming the target material of the present invention further comprises less than 20 atomic % of one or more selected from the group consisting of Zr, Hf, Nb and Ta. Zr, Hf, Nb and Ta are additive elements for accelerating amophization of the thin film. Since a total amount of the additive elements of more than 20 atomic % leads to deteriorations in magnetic characteristics, the additive-element content should be less than 20 atomic %, preferably 5 to 15 atomic %.

The Fe—Co based alloy forming the target material of the present invention further comprises a Co—Fe phase, which is a ferromagnetic phase, as one of the constituent phases of the target materials. The rest of the constituent phases of the target material, apart from the Fe—Co phase, are typically, but not particularly limited to, phases formed of compounds of Co and Fe with Zr, Nb, Ta, and Hf. One or more selected from the group consisting of Zr, Hf, Nb and Ta are incorporated in solid solution form into the Co—Fe phase in a total amount of 0.5 to 2 atomic %. The use of a target material having the structure and composition as described above leads to increases in leakage magnetic flux during the magnetron sputtering process, achieving a high sputtering efficiency and a high sputtering effect. The magnetic permeability of the target material according to the present invention preferably ranges from 10 to 80, more preferably from 15 to 50.

In this connection, when the soft magnetic target is used in magnetron sputtering, it is general that a lower magnetic permeability of the soft magnetic target material results in better effects and that the magnetic permeability of the soft magnetic material has inverse correlation to the coercive force. Accordingly, a soft magnetic target material having a high sputtering efficiency is a target material having a low magnetic permeability (a high coercive force).

Producing Method

The target material according to the present invention can be produced by the use of a raw-material powder prepared by inert gas atomization. The raw-material powder can be prepared through rapid solidification by inert gas atomization. In this case, the inert gas used is not particularly limited, but Ar, $N_2$ or the like can be preferably used.

Then, the powder thus prepared is consolidated at a temperature ranging from 800° C. or higher to $[-294 \times [Fe/(Fe+Co)]+1076]$ ° C. or lower. While this temperature range overlaps the temperature range claimed in above mentioned Japanese Patent Laid-Open Publication No. 2005-320627, the consolidating temperatures of all the Examples of Japanese Patent Laid-Open Publication No. 2005-320627 fall outside the conditions of the present invention. In addition, Japanese Patent Laid-Open Publication No. 2005-320627 discloses a case where Fe is zero percent, and does not mention a range in which at least Fe is added.

The Co—Fe ferromagnetic phase of the powder as atomized contains high concentrations (about 1 to about 2 atomic %) of Zr, Ta, Nb and Hf, which have been forcibly incorporated in solid solution form through rapid solidification in spite of originally low solubility limits, resulting in relatively high coercive forces. In hot consolidation, however, the Zr, Ta, Nb and Hf in the Co—Fe ferromagnetic phase in combination with Co and Fe form compounds with an increase in consolidation temperature. As a result, the concentrations of the Zr, Ta, Nb and Hf incorporated in solid solution form in the Co—Fe ferromagnetic phase decrease, causing a reduction in the coercive force of the target material and thus leading to a reduction in the sputtering efficiency. It is general that coercive force correlates inversely with magnetic permeability.

The higher the consolidation temperature is, the more these compounds form, causing a decrease in the coercive force of the target material. However, controlling the formation temperature on or below a certain temperature enables the Zr, Ta, Nb and Hf in the Co—Fe ferromagnetic phase to be retained in a high total amount of 0.5 to 2 atomic %, resulting in a target material with a high coercive force and thus leading to a satisfactory sputtering efficiency.

The consolidation temperature of $[-294 \times [Fe/(Fe+Co)]+1076]$ ° C. or less means that the higher the Fe concentration is, the lower the temperature the powder needs to be consolidated at. This is assumed to be due to the fact that the solid-solution limits of the Zr, Ta, Nb and Hf are higher in the Co phase than in the Fe phase. However, when the consolidation temperature is lower than 800° C., the sintering properties of the raw-material powder are insufficient, failing to provide a target material with high density. The consolidation temperature is preferably from 850 to 950° C.

In addition, when the powder is consolidated at a temperature of lower than 1100° C. and the consolidation pressure is 500 MPa or higher, the coercive force further increases. For this increase, it is assumed that the strain applied in the consolidating process remains at a low consolidation temperature to increase the coercive force. For example, it is general that the retention of a metal material such as steel materials at a high temperature leads to a recovery of the processing strain while a low retention temperature at this time leads to an insufficient strain recovery.

The consolidating process employed in the present invention is not limited as far as the method is those capable of consolidating a target material with high density, such as HIP, upsetting technique. It is more preferred that the consolidation pressure be 500 MPa or higher from the above-mentioned point of view.

In the case where two or more kinds of powders are mixed to produce a target material comprising not less than 80 atomic % in total of Fe and Co having a Fe:Co ratio of 80:20 to 0:100, and less than 20 atomic % of one or more selected from the group consisting of Zr, Hf, Nb and Ta with a ferromagnetic Co—Fe phase into which the one or more selected from the group consisting of Zr, Hf, Nb and Ta are solid-solved in a total amount of 0.5 to 2 atomic %, the upper limit of the consolidation temperature should be the upper limit in the composition of a powder having a largest Fe/(Fe+Co).

EXAMPLES

The present invention will be described below in detail with reference to examples.

As shown in Table 1, Fe—Co based alloys were produced by a gas atomizing technique. The gas atomizing was conducted on condition that the gas was argon gas, the diameter of a nozzle was 6 mm and the gas pressure was 5 MPa. The powder thus produced was sieved to obtain a powder with particle sizes of 500 μm or less. The resultant powder was agitated for one hour by a V-type mixer.

The powder thus produced was charged into a sealed container made of SS material and having a diameter of 200 mm and a height of 100 mm. Then, the sealed container was exhausted and vacuum-sealed at an ultimate pressure of $10^{-1}$ Pa or less. Then, when using HIP (Hot Isostatic Pressing), a compact is produced on the conditions that the heating temperature is 750 to 1100° C., the consolidation pressure is 150 MPa and the retention time of heating is five hours. When using the upsetting technique, a compact is produced on the conditions that the heating temperature is 800° C., the consolidation pressure is 500 MPa and the retention time of heating is two hours. Then, the compact thus produced was subjected to a machining process to produce various test pieces. The characteristics of the aforementioned target materials are shown in Table 1.

In comparative example No. 16, the magnetic permeability is low not only because the consolidation temperature is higher than $[-294\times[Fe/(Fe+Co)]+1076]$ ° C. but also because the content of one or more selected from the group consisting of

TABLE 1

| No. | Molding Compositions (at %) | $-294 \times$ [Fe/(Fe + Co)] + 1076 (° C.) | Consolidation Temperature (° C.) | Relative Density (%) | Zr, Hf, Nb & Ta Amount in Fe—Co Phase (at %) | Magnetic Permeability | |
|---|---|---|---|---|---|---|---|
| 1 | 91(40Co60Fe)4Zr5Ta | 900 | 800(HIP) | 99.6 | 2.0 | 70 | Inv. |
| 2 | 91(40Co60Fe)4Zr5Ta | 900 | 800(Upset) | 100 | 2.1 | 55 | Ex. |
| 3 | 91(40Co60Fe)4Zr5Ta | 900 | 850(HIP) | 99.8 | 1.5 | 75 | |
| 4 | 91(40Co60Fe)4Zr5Ta | 900 | 900(HIP) | 100 | 0.7 | 80 | |
| 5 | 90(20Co80Fe)6Zr4Nb | 841 | 800(HIP) | 99.7 | 0.6 | 30 | |
| 6 | 90(20Co80Fe)6Zr4Nb | 841 | 840(HIP) | 99.9 | 0.5 | 30 | |
| 7 | 90(20Co80Fe)6Zr4Nb | 841 | 840(Upset) | 100 | 0.7 | 25 | |
| 8 | 90(100Co)5Hf5Ta | 1076 | 800(HIP) | 99.5 | 1.9 | 20 | |
| 9 | 90(100Co)5Hf5Ta | 1076 | 900(HIP) | 99.7 | 1.1 | 20 | |
| 10 | 90(100Co)5Hf5Ta | 1076 | 1000(HIP) | 100 | 0.9 | 25 | |
| 11 | 90(100Co)5Hf5Ta | 1076 | 1000(Upset) | 100 | 1.1 | 15 | |
| 12 | 90(100Co)5Hf5Ta | 1076 | 1070(HIP) | 100 | 0.7 | 30 | |
| 13 | 89(40Co60Fe)4Zr5Ta2Al | 900 | 900(HIP) | 99.5 | 0.6 | 65 | |
| 14 | 91(40Co60Fe)4Zr5Ta2Cr | 900 | 900(HIP) | 99.4 | 0.5 | 65 | |
| 15 | 91(40Co60Fe)4Zr5Ta | 900 | <u>750(HIP)</u> | 97.5 | 2.0 | 90 | Comp. |
| 16 | 91(40Co60Fe)4Zr5Ta | 900 | <u>950(HIP)</u> | 100 | <u>0.2</u> | 120 | Ex. |
| 17 | 90(20Co80Fe)6Zr4Nb | 841 | <u>750(HIP)</u> | 97.4 | 2.1 | 30 | |
| 18 | 90(20Co80Fe)6Zr4Nb | 841 | <u>850(HIP)</u> | 99.9 | <u>0.3</u> | 100 | |
| 19 | 90(100Co)5Hf5Ta | 1076 | <u>750(HIP)</u> | 98.3 | 1.9 | 20 | |
| 20 | 90(100Co)5Hf5Ta | 1076 | <u>1100(HIP)</u> | 100 | <u>0.3</u> | 100 | |

(Underlined part is beyond the conditions of the present invention)
Inv. Ex.: Examples of the present invention
Comp. Ex: Comparative examples Density, the amounts of Zr+Hf+Nb+Ta in the ferromagnetic phases, and magnetic permeability were measured on the target materials thus produced as described below. The leakage magnetic flux to the sputtered surface of the target material should be basically measured by placing a target material in a sputtering apparatus. However, because a certain amount of leakage magnetic flux is ascribable to the magnetic permeability of the target material, magnetic permeability was measured to assess leakage magnetic flux on the target materials in the present invention.

(1) Density

Samples each having a dimension of 20 mm×20 mm×20 mm were obtained from the HIP materials and upsetting materials, and measured by Archimedes method. The results were then expressed in relative density. The relative density is obtained by dividing the density actually measured through Archimedes method by a density calculated from the components, i.e., a value obtained by volume-averaging the density of each component element.

(2) Ferromagnetism (Amount of Zr, Hf, Nb and Ta in Fe—Co Phase)

The samples obtained from the HIP materials and the upsetting materials were ground, and then analyzed by EDX (instrumental analysis on a minute region) (n=10 average).

(3) Magnetic Permeability Measurements

Ring specimens each having an outer diameter of 15 mm, an inner diameter of 10 mm, and a height of 5 mm were made. Then, a B—H tracer was used to measure the magnetic permeability of each ring specimen in an applied magnetic field of 8 kA/m.

As shown in Table 1, Nos. 1 to 14 are examples in accordance with the present invention, and Nos. 15 to 20 are comparative examples. Comparative example No. 15 has a low relative density because the consolidation temperature is low.

Zr, Hf, Nb and Ta in the Fe—Co phase is low. In comparative example No. 17, the consolidation temperature is low while the relative density is low.

In comparative example No. 18, the magnetic permeability is high not only because the consolidation temperature is higher than $[-294\times[Fe/(Fe+Co)]+1076]$ ° C. but also because the content of one or more selected from the group consisting of Zr, Hf, Nb and Ta in the Fe—Co phase is low. In Comparative example No. 19, the consolidation temperature is low, rendering the relative density low. In comparative example No. 20, the magnetic permeability is high not only because the consolidation temperature is higher than $[-294\times[Fe/(Fe+Co)]+1076]$ ° C. but also because the content of one or more selected from the group consisting of Zr, Hf, Nb and Ta is low. In contrast, it can be seen that all examples Nos. 1 to 14 of the present invention satisfy the conditions, resulting in high relative densities and low magnetic permeabilities.

As described above, satisfactory sputtering effects can be achieved by the use of a target material having a total solid-solubility of 0.5 to 2 atomic % of one or more selected from the group consisting of Zr, Hf, Nb and Ta to the Fe—Co phase, which is a ferromagnetic phase, in the constituent phases of the target material. The target material results from consolidating a powder prepared through rapid solidification at a temperature of $[-294\times[Fe/(Fe+Co)]+1076]$ ° C. or less, which means that, the higher the Fe concentration is, the lower the required temperature is. This is due to the fact that the solution limit of the elements of Zr and the like is higher in the Co phase than in the Fe phase.

What is claimed is:

1. A (CoFe)Zr/Nb/Ta/Hf based target material, which is made of an Fe—Co based alloy comprising:
   not less than 80 atomic % in total of Fe and Co having an Fe:Co atomic ratio of 80:20 to 60:40, and
   less than 20 atomic % of one or more selected from the group consisting of Zr, Hf, Nb and Ta, wherein the Fe—Co based alloy comprises a Co—Fe phase being a ferromagnetic phase, and wherein the one or more selected from the group consisting of Zr, Hf, Nb and Ta are incorporated in solid solution form into the Co—Fe phase in a total amount of 0.5 to 2 atomic %.

2. A target material according to claim 1, having a magnetic permeability of 15 to 80.

* * * * *